US006486751B1

(12) United States Patent
Barber et al.

(10) Patent No.: US 6,486,751 B1
(45) Date of Patent: Nov. 26, 2002

(54) INCREASED BANDWIDTH THIN FILM RESONATOR HAVING A COLUMNAR STRUCTURE

(75) Inventors: Bradley Paul Barber, Chatham, NJ (US); Edward Chan, New Providence, NJ (US); John Edwin Graebner, Short Hills, NJ (US)

(73) Assignee: Agere Systems Inc., Allentown, PA (US)

( * ) Notice: Subject to any disclaimer, the term of this patent is extended or adjusted under 35 U.S.C. 154(b) by 63 days.

(21) Appl. No.: 09/669,944

(22) Filed: Sep. 26, 2000

(51) Int. Cl.[7] .......................... H03H 9/17; H03H 9/205; H03H 9/54; H03H 3/007
(52) U.S. Cl. ....................... 333/187; 333/189; 333/191; 333/192; 29/25.35; 310/322; 310/324; 310/335
(58) Field of Search ................................. 333/186–192; 310/321, 322, 324, 335; 29/25.35

(56) References Cited

U.S. PATENT DOCUMENTS

| 4,386,328 A | 5/1983 | Masuda et al. ............... 333/202 |
| 4,502,932 A | 3/1985 | Kline et al. ............ 204/192 EC |
| 4,556,812 A | 12/1985 | Kline et al. ................... 310/324 |
| 4,719,383 A | 1/1988 | Wang et al. ................... 310/324 |
| 4,890,370 A | 1/1990 | Fukuda et al. .............. 29/25.35 |
| 4,988,957 A | 1/1991 | Thompson et al. .......... 331/107 |
| 5,075,641 A | 12/1991 | Weber et al. ............ 331/108 C |
| 5,166,646 A | 11/1992 | Avanic et al. ........... 331/107 A |
| 5,185,589 A | 2/1993 | Krishnaswamy et al. ... 333/133 |
| 5,231,327 A | 7/1993 | Ketcham ..................... 310/366 |
| 5,232,571 A | 8/1993 | Braymen ................. 204/192.22 |
| 5,233,259 A | 8/1993 | Krishnaswamy et al. ... 310/324 |
| 5,260,596 A | 11/1993 | Dunn et al. ................... 257/414 |
| 5,283,458 A | 2/1994 | Stokes et al. ................ 257/416 |
| 5,291,159 A | 3/1994 | Vale ............................. 333/188 |
| 5,294,898 A | 3/1994 | Dworsky et al. ............ 333/187 |
| 5,303,457 A | 4/1994 | Falkner, Jr. et al. ........ 29/25.35 |
| 5,334,960 A | 8/1994 | Penunuri ...................... 333/193 |
| 5,348,617 A | 9/1994 | Braymen ...................... 156/644 |
| 5,367,308 A | 11/1994 | Weber ................. 343/700 MS |
| 5,373,268 A | 12/1994 | Dworsky et al. ............ 333/187 |
| 5,381,385 A | 1/1995 | Greenstein ................... 367/140 |
| 5,403,701 A | 4/1995 | Lum et al. ................... 430/315 |

(List continued on next page.)

OTHER PUBLICATIONS

R. Ruby et al., "Micromachined Thin Film Bulk Acoustic Resonators", *IEEE 1994 Frequency Control Symposium*; Jun., 1994, pp. 135–138.*
H. Morkner et al., "An Integrated FBAR Filter and PHEMT Switched–Amp For Wireless Applications", *1999 IEEE MTT–S Digest*; May, 1999, pp. 1393–1395.*
R. Ruby, "Micromachined Cellular Filters", *1996 IEEE MTT–S Digest*; Jun., 1996, pp. 1149–1152.*

Primary Examiner—Robert J. Pascal
Assistant Examiner—Barbara Summons
(74) Attorney, Agent, or Firm—Ratner & Prestia

(57) ABSTRACT

Improved bandwidths and oscillation uniformity is obtained through a rod type BAW TFR structure formed over a semiconductor support. The resonator includes a first and a second electrode and a plurality of distinct elemental piezoelectric structures between the electrodes. Each of the piezoelectric structures has a length, a width and a height, the height being the distance between the electrodes. The height of the piezoelectric structures is at least equal to or more than one of the length or the width, or both. Such resonator is made by forming on a common bottom a plurality of distinct piezoelectric structures each having a length, a width and a height, wherein the height is formed at least equal to the width or the length of the piezoelectric structure, and forming a common top electrode thereover.

29 Claims, 3 Drawing Sheets

U.S. PATENT DOCUMENTS

| | | | |
|---|---|---|---|
| 5,404,628 A | 4/1995 | Ketcham | 29/25.35 |
| 5,438,554 A | 8/1995 | Seyed-Bolorforosh et al. | 367/140 |
| 5,446,306 A | 8/1995 | Stokes et al. | 257/416 |
| 5,552,655 A | 9/1996 | Stokes et al. | 310/330 |
| 5,559,358 A | 9/1996 | Burns et al. | 257/431 |
| 5,587,620 A | 12/1996 | Ruby et al. | 310/346 |
| 5,596,239 A | 1/1997 | Dydyk | 310/311 |
| 5,617,065 A | 4/1997 | Dydyk | 333/186 |
| 5,630,949 A | 5/1997 | Lakin | 216/61 |
| 5,646,583 A | 7/1997 | Seabury et al. | 333/187 |
| 5,692,279 A | 12/1997 | Mang et al. | 29/25.35 |
| 5,698,928 A | 12/1997 | Mang et al. | 310/322 |
| 5,702,775 A | 12/1997 | Anderson et al. | 428/1 |
| 5,714,917 A | 2/1998 | Ella | 332/144 |
| 5,760,663 A | 6/1998 | Pradal | 333/187 |
| 5,780,713 A | 7/1998 | Ruby | 73/1.82 |
| 5,789,845 A | 8/1998 | Wadaka et al. | 310/334 |
| 5,815,054 A * | 9/1998 | Vojak et al. | 333/191 |
| 5,821,833 A | 10/1998 | Lakin | 333/187 |
| 5,847,792 A * | 12/1998 | Kobayashi et al. | 349/110 |
| 5,853,601 A | 12/1998 | Krishaswamy et al. | 216/2 |
| 5,864,261 A | 1/1999 | Weber | 333/187 |
| 5,872,493 A | 2/1999 | Ella | 333/191 |
| 5,873,153 A | 2/1999 | Ruby et al. | 29/25.35 |
| 5,873,154 A | 2/1999 | Ylilammi et al. | 29/25.35 |
| 5,883,575 A | 3/1999 | Ruby et al. | 340/572.5 |
| 5,884,378 A | 3/1999 | Dydyk | 29/25.35 |
| 5,894,647 A | 4/1999 | Lakin | 29/25.35 |
| 5,910,756 A | 6/1999 | Ella et al. | 333/133 |
| 5,923,390 A * | 7/1999 | Jung Mok et al. | 349/38 |
| 5,928,598 A | 7/1999 | Anderson et al. | 264/446 |
| 5,942,958 A | 8/1999 | Lakin | 333/189 |
| 5,963,856 A | 10/1999 | Kim | 455/307 |
| 6,051,907 A | 4/2000 | Ylilammi | 310/312 |
| 6,060,818 A | 5/2000 | Ruby et al. | 310/363 |
| 6,081,171 A | 6/2000 | Ella | 333/189 |
| 6,087,198 A | 7/2000 | Panasik | 438/51 |
| 6,127,768 A | 10/2000 | Stoner et al. | 310/313 A |
| 6,150,703 A | 11/2000 | Cushman et al. | 257/415 |
| 6,198,208 B1 | 3/2001 | Yano et al. | 310/358 |
| 6,204,737 B1 | 3/2001 | Ella | 333/187 |
| 6,215,375 B1 | 4/2001 | Larson, III et al. | 333/187 |
| 6,252,290 B1 * | 6/2001 | Quek et al. | 257/522 |

* cited by examiner

INCREASED BANDWIDTH THIN FILM RESONATOR HAVING A COLUMNAR STRUCTURE

BACKGROUND OF THE INVENTION

The present invention relates to thin film resonators (TFR), and more particularly to a thin film bulk acoustic wave (BAW) resonator structure that provides increased bandwidth, and to the method of manufacturing such resonator structures.

Thin film resonators (hereinafter "TFR") are typically used in high-frequency environments ranging from several hundred megahertz (MHz) to several Gigahertz (GHz). A TFR component typically comprises a piezoelectric material interposed between two conductive electrodes, one of which is formed on a support structure such as a membrane, or on a plurality of alternating reflecting layers formed on a semiconductor substrate which may be made of silicon or quartz, for example, or on another support structure. The piezoelectric material preferably comprises ZnO, CdS, AlN, or combinations thereof. The electrodes are most often formed from a conductive material such as Al, Mo, Pt, Cu, Au, Ti, Cr, and combinations thereof, but may be formed from other conductors as well.

TFR components are often used in filters, more particularly in TFR filter circuits applicable to a myriad of communication technologies. For example, TFR filter circuits may be employed in cellular, wireless and fiber-optic communications, as well as in computer or computer-related information-exchange or information-sharing systems.

The desire to render these increasingly complicated communication systems portable and even hand-held places significant demands on filtering technology, particularly in the context of increasingly crowded radio frequency resources. TFR filters must meet strict performance requirements which include: (a) being extremely robust, (b) being readily mass-produced and (c) being able to sharply increase performance to size ratio achievable in a frequency range extending into the Gigahertz region. Moreover, some of the typical applications noted above for these TFR filters require passband widths up to 4% of the center frequency (for example, for a 2 GHz center frequency, this would be a bandwidth of about 80 MHz). This bandwidth is vital to covering some of the wider bandwidth RF filter applications such as GSM (Global system for mobile communications.)

This bandwidth is not easily achieved using common piezoelectrics such as AlN, especially on solidly mounted resonators on acoustic mirrors which heretofore typically exhibit resonance/anti-resonance separations of 2% or less. Additionally these devices show undesirable lateral non uniform wave oscillation that degrades the device performance due to the large width to thickness ratios of TFR devices.

Some solutions to the inadequate bandwidth problem include the addition of external inductance to the TFR elements when used in filters. However such solution does not address the fundamental limitation in the TFR itself and incorporates at least one additional element in the manufacture of a TFR filter There is, therefore, still a need for a TFR structure for use in the 2 Gigahertz frequency range with an improved bandwidth.

SUMMARY OF THE INVENTION

This invention provides a thin film resonator comprising a plurality of distinct elemental resonators separated by spaces and connected in parallel. Each of the elemental resonators has a length, a width and a height. The elemental resonator height is at least equal to one of the width or length of the elemental resonator.

According to this invention there is also provided a thin film acoustic resonator comprising a support, a first electrode over said support, a piezoelectric layer on said first electrode and a second electrode on said piezoelectric layer wherein said piezoelectric layer comprises a plurality of substantially similar distinct piezoelectric structures adjacent and separated from each other by spaces. Each of said structures has a length, a width and a height, the height being at least equal to either width or length. The electrodes electrically connect the piezoelectric structures in parallel.

Still according to this invention, there is provided an acoustic resonator filter comprising at least one thin film acoustic resonator comprising a plurality of distinct elemental resonators separated by interstitial spaces and connected in parallel each of said elemental resonators having a length, a width and a height, wherein the height is at least equal to one of either the width or length of the elemental resonator.

The above described resonators exhibit improved bandwidths and oscillation uniformity.

Further according to the present invention, is provided a method of manufacturing a thin film resonator, the method comprising forming on a common first electrode a plurality of distinct piezoelectric structures each of said structures comprising a length, a width and a height, wherein the height is formed at least equal to either one of the width or length, and forming a common second electrode on said structures.

BRIEF DESCRIPTION OF THE DRAWINGS

The invention can be more fully understood from the following description thereof in connection with the accompanying drawings described as follows.

DETAILED DESCRIPTION OF THE INVENTION

Figure 1:
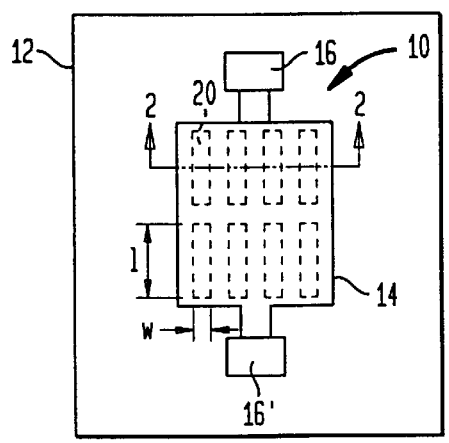
FIG. 1 is a schematic illustration of a top view of a first embodiment of a TFR according to the present invention.

Throughout the following detailed description, similar reference characters refer to similar elements in all figures of the drawings. The drawings which are not to scale, are illustrative only and are used in order to explain, rather than limit the invention. The use of terms such as height, length, width, top, bottom, is strictly to facilitate the description of the invention and is not intended to limit the invention to a specific orientation. For example, height does not imply only a vertical rise limitation, but is used to identify one of the three dimensions of a three dimensional structure as shown in the figures. Thus the piezoelectric material "height" identifies the thickness of the piezoelectric material between a first and a second electrode. Such "height" would be vertical where the electrodes are horizontal but would be horizontal where the electrodes are vertical, and so on. Similarly, while all figures show the different layers as horizontal layers such orientation is for descriptive purpose only and not to be construed as a limitation.

Figure 2:
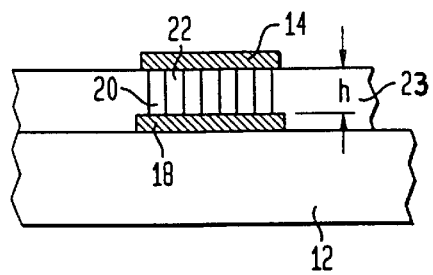
FIG. 2 is a schematic illustration of a cross section of the structure shown in FIG. 1 taken along arrows 2—2.

Referring next to FIGS. 1 and 2 there is shown a TFR 10 constructed in accordance with a first embodiment of the present invention on a support 12. Preferably the support is a semiconductor wafer such as a Si wafer of the type commonly used in the manufacture of integrated electronic circuits particularly VLSI circuits. While the TFR is shown as resting on the top surface of the semiconductor substrate, it is to be understood that the TFR may also be constructed on top of additional layers over the wafer surface.

In accordance with the present invention, the TFR comprises three layers: a first electrode 18, a piezoelectric material 20, and a second electrode 14 as best shown in FIG. 2. An additional dielectric layer 23 may be present separating the second and first electrode connections to other circuitry. Such connections are shown schematically by pads 16 and 16'. It is recognized that while pads are commonly used, the connection could be conductive lines 17 (shown in FIG. 3) leading to other circuits on the wafer or to other TFRs interconnecting them to form filters comprising more than one TFR. It is also recognized that such lines may be conductive buses having lower resistivity than the second and first electrodes. Such lower resistivity may be achieved by increased cross sectional thickness of the bus line, or by the use of material exhibiting higher conductivity than the material used for the electrodes.

Using well known patterning and etching techniques such as photomasking and RIE etching, the piezoelectric layer is patterned to form a plurality of distinct piezoelectric structures 20 that extend up from the first electrode surface away from the wafer surface. Each of the structures 20 has a height "h" a width "w" and a length "l". In accordance with the present invention at least one of the width "w" or length "l" of the piezoelectric material is equal to or less than the height "h" of the piezoelectric layer. As a result the resulting structures are in the form of thin, tall piezoelectric walls standing alone on the first electrode. Useful piezoelectric materials are AlN, Cds, ZnO and combinations thereof.

Following the etching of the piezoelectric material, a second electrode 14 is formed on the top of the piezoelectric structures 20. This second electrode is preferably formed by first filling the interstitial spaces 22 separating the individual piezoelectric walls with a sacrificial material, planarizing the surface of the sacrificial material and piezoelectric, depositing a conductive layer 14 over the planarized surface in contact with the upper surface of the patterned piezoelectric layer and etching away the sacrificial material leaving the interstitial spaces 22 empty. Alternatively, the sacrificial dielectric material can be left behind if it has low dielectric constant such as the polymers typically used in multi-level interconnect technologies. Typical electrode materials are Al, Mo, Ti, Cr, CU, Ag, Pt, Au and combinations thereof.

The resulting structure is a plurality of individual elemental resonators all connected in parallel through their common electrodes 18 and 14. The parallel assembly of elemental resonators behaves substantially as a rod type resonator providing an increased electromechanical coupling factor $k^2$ and as result a larger separation of resonant and antiresonant frequency poles than a similar single plate bulk acoustic wave (BAW) resonator. The number of parallel connected structures is a function of the frequency, power handling and impedance matching requirements for a particular filter.

A typical such filter structure may be constructed on a Silicon wafer surface by depositing an aluminum layer (Al) about $0.1$–$0.3 \times 10^{-6}$ meters and patterning the layer to form a first electrode of generally square shape connected to a connecting tab. A piezoelectric layer of aluminum nitride (AlN) about $2.7 \times 10^{-6}$ meters thick is deposited over the first electrode and patterned to form distinct wall like structures having a width of about $1.5 \times 10^{-6}$ meters and a length of $100 \times 10^{-6}$ meters. The structures are separated by interstitial spaces of about $1$–$3 \times 10^{-6}$ meters. A second electrode, also of aluminum is then formed to a thickness of about $0.1$–$0.3 \times 10^{-6}$ meters opposite the first electrode and extending over all the piezoelectric wall like structures completing the TFR In all of the following examples of TFR structures, the height of the piezoelectric structure always equals or exceeds at least one of the length or width of the structure, whether or not so mentioned with respect to each embodiment description.

Figure 3:
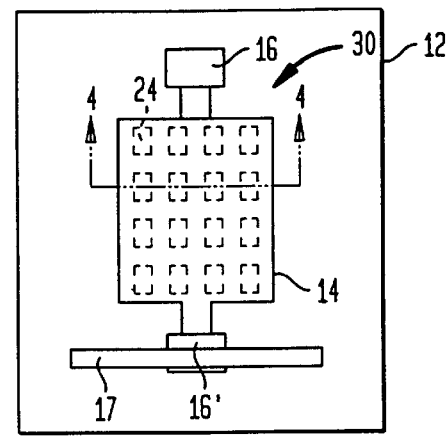
FIG. 3 is a schematic illustration of a top view of a second embodiment of a TFR according to the present invention
Figure 4:
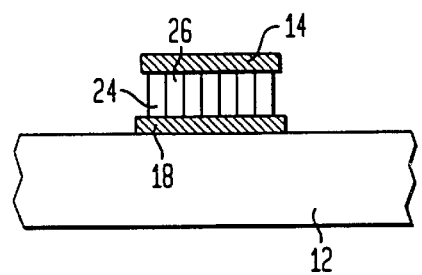
FIG. 4 is a schematic illustration of a cross section of the structure shown in FIG. 3 taken along arrows 4—4.

FIGS. 3 and 4 show an alternate resonator structure 30 in accordance with the present invention. As shown in FIG. 3, the resonator is again formed on a support 12 which may again be a semiconductor wafer. The resonator again has a first electrode 18 and a second electrode 14. The piezoelectric layer in this embodiment has been patterned to form a columnar structure 24 rather than a wall type structure shown in FIGS. 1 and 2, with the width "w" and length "l" substantially the same. In addition, an optional filler material 26 is used to fill the interstitial spaces. Such low dielectric filler material may for example be low temperature oxide (LTO), porous $SiO_2$, a polymer such as polymethylmethacrylate (PMMA), a polyimide, or other "soft" filler material with low dielectric constant. In the context of this description, "soft" material is material with low density and low Young's modulus (Low stiffness) resulting in acoustic impedance lower than that of the piezoelectric material. Similarly, low dielectric constant is dielectric constant <5, and preferably <2.

Such TFR structure, in the case where $l=w=1.5 \times 10^{-6}$ meters and $h=2.7 \times 10^{-6}$ meters is calculated, using finite element analysis, to exhibit a 4% bandwidth in the same 2 GHz band frequency.

A plurality of columnar structures all connected in parallel, are used to provide comparable power handling and electrical impedance matching abilities as the TFRs of the prior art.

Figure 5:
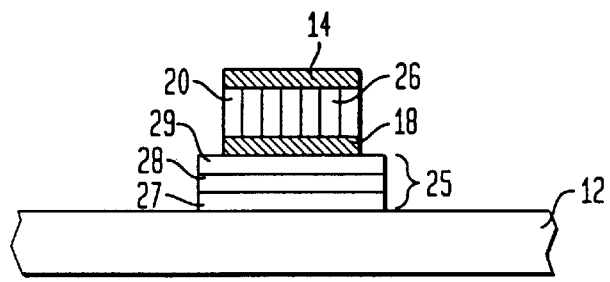
FIG. 5 is a schematic illustration of a cross section of a TFR constructed in accordance with the present invention on a support comprising an acoustic reflector.

FIG. 5 shows yet another TFR structure in accordance with the present invention. On a substrate 12 there is first formed an acoustic mirror 25 comprising a plurality of alternating ¼ wave length acoustically reflecting layers 27, 28, and 29 to form a Bragg stack. Acoustically reflecting mirrors for use in TFRs are well known. See for instance U.S. Pat. No. 5,910,756 issued to Juha Ella, FIG. 3a and associated description in columns 12 and 13. The resulting columnar patterned TFR on a continuous acoustic mirror typically has a calculated bandwidth of about 2.5% in the 2 Gigahertz band. In contrast, a typical TFR having the same thickness and a length and width each equal to $100 \times 10^{-6}$ meters exhibits a bandwidth of only about 2% in the same 2 Gigahertz band.

When using an acoustic mirror under the TFR, the acoustic mirror may also be patterned in a pattern that corresponds to the piezoelectric material pattern. The resulting columnar patterned TFR and mirror resonator typically has a calculated bandwidth of about 3.2% in the 2 Gigahertz band. On the other hand, a patterned wall type TFR of the type shown in FIG. 1, over a patterned mirror resonator patterned so that the mirror layers are only under the individual TFRs and do not extend under the interstitial spaces, has a calculated bandwidth of about 3.0% in the 2 Gigahertz band.

The remainder of the TFR is then built over the acoustic mirror by again forming a first electrode 18 on the upper reflecting layer 29, forming a patterned piezoelectric layer to form wall type or columnar type piezoelectric structures 20 on the electrode 18. The interstitial spaces may be either filled with a soft filler material 26, or left empty. A second electrode 14 common to all piezoelectric structures 20 completes the TFR.

Figure 6:
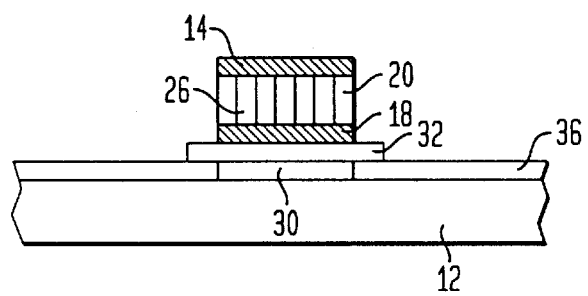
FIG. 6 is a schematic illustration of a cross section of a TFR constructed in accordance with the present invention on a support comprising a cavity formed under the resonator.

The acoustic mirror may be replaced with a cavity 30 as shown in FIG. 6. Such cavity may be formed under the TFR by forming the first electrode 18 on a supporting membrane 32. The aforementioned patent to Ella discloses (in FIGS. 4a and 5a) ways to form a TFR BAW resonator on a supporting membrane over a cavity.

Figure 7:
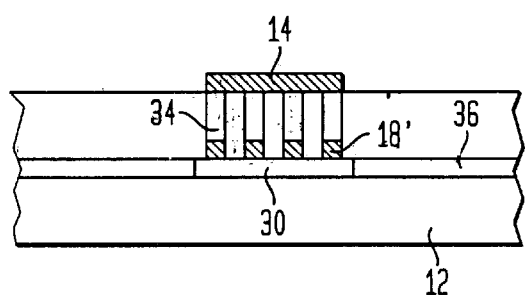
FIG. 7 is a schematic illustration of another embodiment of the present invention wherein the patterned piezoelectric membrane bridges over a cavity in the TFR support.

In an alternate structure, the supporting membrane may be eliminated. In this case the piezoelectric layer extends over the cavity and is patterned to form piezoelectric wall structures 34 that bridge the cavity. These wall structures 34 are self supporting. The first electrode 18' of each of the elemental TFRs is formed on the underside of the piezoelectric wall structures and is adhered to and supported by the piezoelectric material, as shown in FIG. 7.

In a preferred manner of manufacturing a TFR over a cavity, the cavity 30 may be etched under the TFR from the front of the wafer using selective etching to etch a layer of high resistivity silicon 36 coated over a layer forming a bottom etch barrier, through vias in the membrane. In the example given above where the TFR comprises Al, AlN, Al, the membrane is the AlN layer, and the support is a silicon wafer, such barrier may be created by first growing or depositing a $SiO_2$ layer over the silicon wafer surface and depositing through sputtering the high resistivity layer 36. Dry etching using $XeF_2$ may be used to etch the high resistivity layer 36 from under the TFR by opening access vias in the membrane 32 while leaving the Al and AlN intact. Edge barrier layers (not shown) may be used if desired to limit the cavity lateral area.

Figure 8:
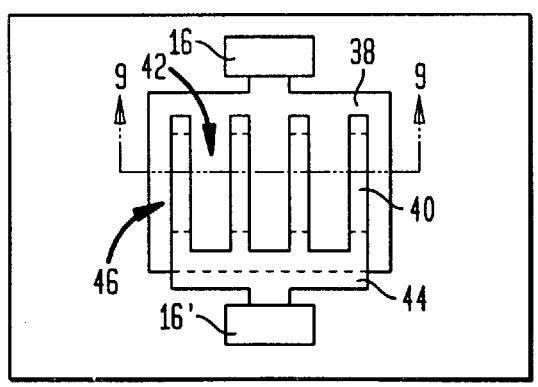
FIG. 8 is a schematic illustration of a top view of yet another embodiment of the present invention wherein the second electrode is formed over the piezoelectric material and not over the interstitial spaces.
Figure 9:
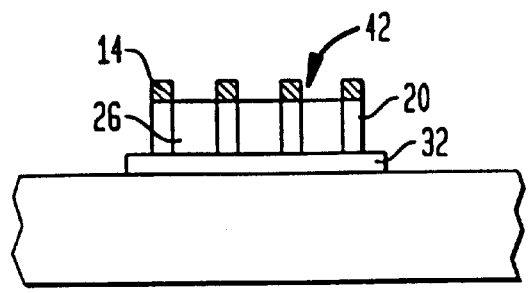
FIG. 9 is a schematic illustration of a cross section of the structure shown in FIG. 8 taken along arrows 9—9.

FIGS. 8 and 9 show yet another TFR structure in accordance with this invention. In this instance, the TFR comprises a common first electrode 38 over which is a patterned piezoelectric layer having a plurality of piezoelectric structures 40 separated by interstitial spaces 42. The interstitial spaces may again be filled with a filler material 26 or may be empty. The TFR also comprises a second electrode 44 connected to a bonding pad 16'. The second electrode 44 has a plurality of tines 46 extending over the piezoelectric structures but not over the interstitial spaces.

Figure 10:
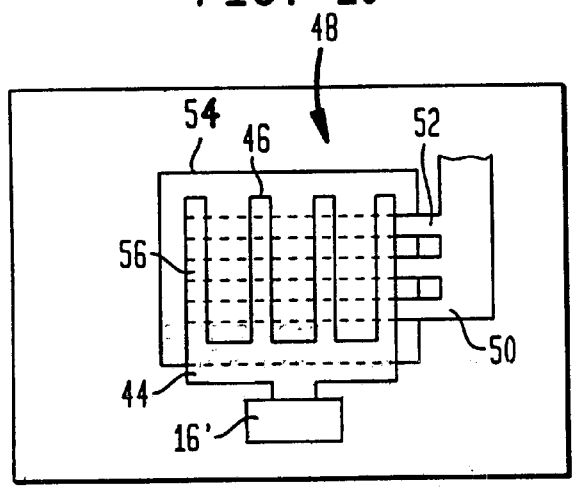
FIG. 10 is a schematic illustration of a top view of yet another embodiment of the present invention wherein the top and first electrodes are formed with intersecting fingerlike extensions.

FIG. 10 is yet an alternate embodiment of a TFR structure in accordance with the present invention built over an acoustic mirror 54. TFR 48 has a first electrode 50 comprising a first plurality of tines 52 and a second electrode 44 comprising a second plurality of tines 46. Tines 46 and 52 form an angle, preferably a 90° angle. The piezoelectric layer is formed as a layer comprising a plurality of columnar piezoelectric structures 56 at the crossover of the second and first electrode tines.

Figure 11:
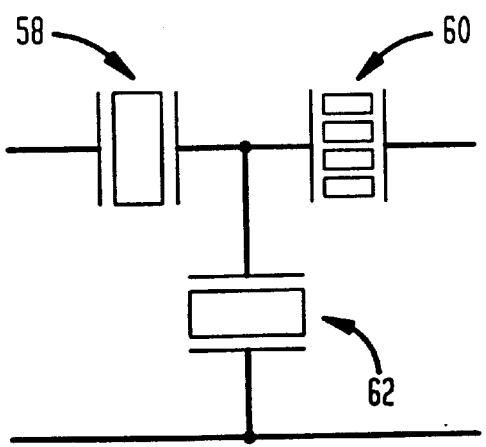
FIG. 11 is a schematic representation of a typical ladder type filter incorporating TFRs in accordance with the present invention.

A plurality of TFRs, at least one of which is constructed in accordance with the present invention, may be used in fabricating a filter such as disclosed inter alia in the aforementioned Ella patent. As shown in the FIG. 11 such filter in its simplest form may comprise a first TFR 58 serially connected with a second TFR 60. The second TFR 60 is shown constructed in accordance with any one of the embodiments of this invention. A third TFR 62 is connected in shunt mode to form a basic "T" structure filter. While only TFR 60 is shown as being formed from a plurality of distinct elemental TFRs connected in parallel according to this invention, all three TFRs may be so constructed depending on the particular application and need for which such filter is intended.

In addition to the use of TFRs according to this invention in filter applications such TFRs may also be used in other electrical circuits including but not limited to RF timing circuits and Voltage controlled oscillators.

Those having the benefit of the foregoing description of this invention may provide modifications to the embodiment herein described, such as size and shape of the resonator, cavity, piezoelectric structure shape and dimensions etc. or may create diverse types of filters and other electrical circuits on semiconductor substrates, containing more than one resonators adjacent to each other and interconnected electrically.

These and other modifications are to be construed as being encompassed within the scope of the present invention as set forth in the appended claims wherein we claim:

1. A thin film resonator comprising a plurality of distinct elemental resonators separated by spaces and connected in parallel, each of said resonators having a length, a width and a height, wherein said height is at least equal to one of said width and said length, wherein said spaces separating said elemental resonators are filled with a low dielectric constant filler material and electrical connection means for connecting said parallel connected elemental resonators to other circuitry.

2. The thin film resonator according to claim 1, wherein said plurality of distinct elemental resonators share at least one common electrode.

3. The thin film resonator according to claim 1 wherein said height is at least equal to both said length and said width.

4. The thin film resonator according to claim 1 wherein said low constant dielectric filler material has a dielectric constant <5 and exhibits acoustic impedance lower than the acoustic impedance exhibited by the piezoelectric material.

5. The thin film resonator according to claim 1 further comprising an acoustic mirror.

6. The thin film acoustic resonator according to claim 5 wherein said acoustic mirror is located only under said plurality of distinct elemental resonators.

7. The thin film resonator according to claim 1 wherein said elemental resonators each comprise a piezoelectric material over a first supporting membrane extending over a cavity, said cavity located under the plurality of distinct elemental resonators.

8. The thin film resonator according to claim 1 wherein said elemental resonators are each self supporting and bridge over a cavity located under the plurality of distinct elemental resonators.

9. The thin film acoustic resonator according to claim 8 wherein under each of said elemental resonators and in contact therewith is a first conductive thin film.

10. The thin film acoustic resonator according to claim 9 further comprising a second conductive film opposite said first conductive film, said second conductive film being over said elemental resonators and in contact therewith.

11. A thin film acoustic resonator comprising a support, a first electrode over said support, a piezoelectric layer on said first electrode and a second electrode on said piezoelectric layer wherein said piezoelectric layer comprises a plurality of substantially identical distinct piezoelectric structures adjacent and separated from each other by spaces, said spaces filled with a low dielectric constant filler material, each of said structures having a length, a width and a height, said height being at least equal to one of said width and said length, said electrodes electrically connecting said piezoelectric structures in parallel, a first electrical connection means for connecting to said first electrode and a second electrical connection means for connecting to said second electrode.

12. The thin film acoustic resonator according to claim 11 wherein said piezoelectric structures are elongated piezoelectric structures having a length and at least one of said first and second electrode extends over and along said length of said elongated piezoelectric structures in contact therewith and does not extend substantially over the spaces.

13. The thin film resonator according to claim 12 wherein said at least one of said second and first electrode is the second electrode and wherein the first electrode comprises a plurality of conductive strips extending in a direction crossing the length of said plurality of elongated piezoelectric structures.

14. The thin film resonator according to claim 13 wherein said direction is substantially perpendicular to said length of said structures.

15. The thin film bulk acoustic resonator according to claim 11 further comprising at least one conductive bus along a side of at least one of said second and first electrode said conductive bus having lower resistance than said second and first electrodes.

16. The thin film resonator according to claim 11 wherein said support comprises a stack of acoustically reflecting layers under said thin film resonator.

17. The thin film resonator according to claim 11 wherein said support comprises a membrane extending over a cavity in said support, and wherein said resonator is over said membrane and said cavity.

18. The thin film resonator according to claim 11 wherein said piezoelectric material comprises an element selected from the group consisting of AlN, CdS, ZnO and combinations thereof.

19. The thin film resonator according to claim 18 wherein the electrodes comprise Al, Mo, Ti, Cr, Ag, Pt, Cu, Au and combinations thereof.

20. An electronic circuit on a semiconductor substrate comprising at least one thin film acoustic resonator comprising a plurality of distinct elemental resonators separated by spaces and connected in parallel wherein said spaces separating said elemental resonators are filled with a low dielectric constant filler material, each of said elemental resonators having a length, a width and a height, wherein said height is at least equal to one of said width and said length.

21. The electronic circuit according to claim 20 wherein said circuit is an acoustic resonator filter.

22. A method of manufacturing a thin film resonator comprising:

forming a first electrode on a support;

forming a piezoelectric layer on said first electrode, said layer having a thickness;

etching said piezoelectric layer to form a pattern of a plurality of distinct piezoelectric structures on said first electrode, each of said structures having a length, a width and a height, the height being substantially the same as the piezoelectric layer thickness, wherein one of said length and said width is equal to or less than the structure height;

filling said spaces with a low dielectric constant dielectric filler material that has a dielectric constant >5 and exhibits acoustic impedance lower than the acoustic impedance exhibited by the piezoelectric material; and forming a second electrode on said etched and filled piezoelectric layer, said second electrode spaced from said first electrode.

23. The method according to claim 22 wherein said dielectric material is a low temperature oxide (LTO).

24. The method according to claim 22 wherein said dielectric material is porous $SiO_2$.

25. The method according to claim 22 wherein said dielectric material is a polymer.

26. The method according to claim 22 wherein said dielectric material is a polyimide.

27. The method according to claim 22 further comprising forming said first electrode over an acoustic mirror formed in said supporting structure.

28. The method according to claim 22 further comprising forming said first electrode as a self supporting membrane over a cavity on a supporting structure.

29. A thin film acoustic resonator comprising a support, a first electrode over said support, a piezoelectric layer on said first electrode and a second electrode on said piezoelectric layer wherein said first electrode comprises a plurality of elongated strips extending along a first direction substantially parallel to said support, said second electrode also comprises a plurality of strips extending along a second direction also parallel to said support, said second direction crossing said first direction forming a plurality of crossover areas, and wherein said piezoelectric layer comprises a plurality of substantially identical distinct piezoelectric structures adjacent and separated from each other by spaces, each of said structures having a length, a width and a height, said height being at least equal to one of said width and said length, said piezoelectric structures located substantially between said first and said second electrodes in said crossover area.

* * * * *

UNITED STATES PATENT AND TRADEMARK OFFICE
CERTIFICATE OF CORRECTION

PATENT NO.    : 6,486,751 B1
DATED         : November 26, 2002
INVENTOR(S)   : Bradley Paul Barber, Edward Chan and John Edwin Graebner It is certified that error appears in the above-identified patent and that said Letters Patent is hereby corrected as shown below:

<u>Column 8,</u>
Line 24, delete ">5" and insert -- <5 --

Signed and Sealed this

Third Day of June, 2003

JAMES E. ROGAN
*Director of the United States Patent and Trademark Office*